United States Patent
Dong et al.

(10) Patent No.: US 9,343,159 B2
(45) Date of Patent: May 17, 2016

(54) AVOIDING UNINTENTIONAL PROGRAM OR ERASE OF A SELECT GATE TRANSISTOR

(71) Applicant: SanDisk Technologies Inc., Plano, TX (US)

(72) Inventors: Yingda Dong, San Jose, CA (US); Liang Pang, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/465,244

(22) Filed: Aug. 21, 2014

(65) Prior Publication Data

US 2016/0055915 A1    Feb. 25, 2016

(51) Int. Cl.
*G11C 16/16*    (2006.01)
*G11C 16/14*    (2006.01)
*G11C 16/04*    (2006.01)
*G11C 11/56*    (2006.01)
*G11C 16/34*    (2006.01)

(52) U.S. Cl.
CPC ............ *G11C 16/14* (2013.01); *G11C 11/5635* (2013.01); *G11C 16/0483* (2013.01); *G11C 16/3418* (2013.01); *G11C 16/3445* (2013.01)

(58) Field of Classification Search
CPC ........................................................ G11C 16/16
USPC ........................................ 365/185.29, 185.33
See application file for complete search history.

(56) References Cited

U.S. PATENT DOCUMENTS

| 8,004,900 | B2 | 8/2011 | Dutta et al. | |
| 8,023,327 | B2* | 9/2011 | Futatsuyama | 365/185.17 |
| 8,634,246 | B2* | 1/2014 | Kang et al. | 365/185.17 |
| 8,654,586 | B2* | 2/2014 | Kito et al. | 365/185.18 |
| 8,787,094 | B2* | 7/2014 | Costa et al. | 365/185.29 |
| 2013/0163336 | A1 | 6/2013 | Li et al. | |
| 2013/0279257 | A1 | 10/2013 | Costa et al. | |
| 2013/0314995 | A1* | 11/2013 | Dutta et al. | 365/185.17 |
| 2014/0198575 | A1 | 7/2014 | Dutta et al. | |

OTHER PUBLICATIONS

International Search Report & The Written Opinion of the International Searching Authority dated Oct. 14, 2015, International Application No. PCT/US2015/042883.

* cited by examiner

*Primary Examiner* — Son Mai
(74) *Attorney, Agent, or Firm* — Vierra Magen Marcus LLP

(57) ABSTRACT

Techniques are provided for preventing inadvertent program or erase of select gate transistors and dummy memory cells during an erase operation involving data-storing memory cells in a three-dimensional memory device. The erase operation charges up a channel of a NAND string using gate-induced drain leakage from the select gate transistors. An erase voltage waveform and a select gate waveform are ramped up to intermediate levels which allow some charging of the channel to occur. The intermediate level of the select gate waveform is low enough to avoid inadvertent programming of the select gate transistors. Subsequently, the erase voltage waveform and the select gate waveform are ramped up to peak levels which allow additional charging of the channel to occur. The peak levels are set to avoid inadvertent erasing of the select gate transistors.

21 Claims, 15 Drawing Sheets

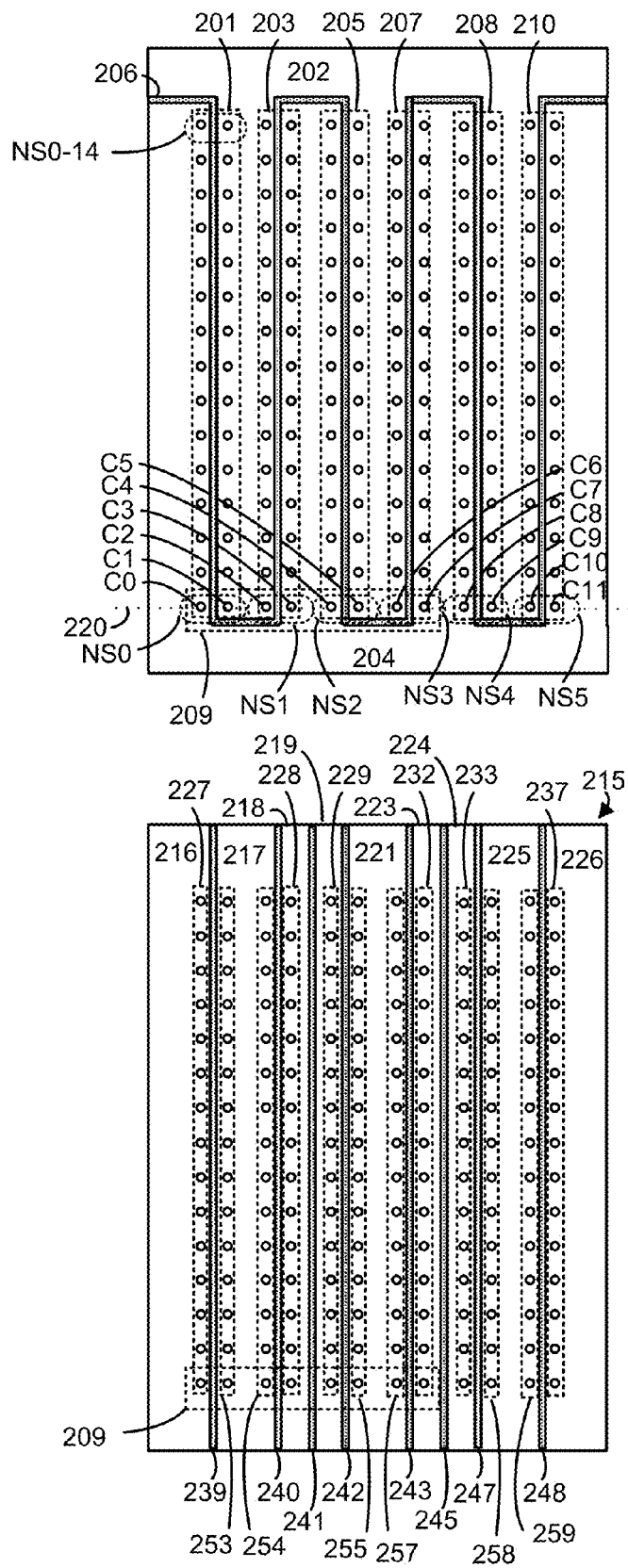

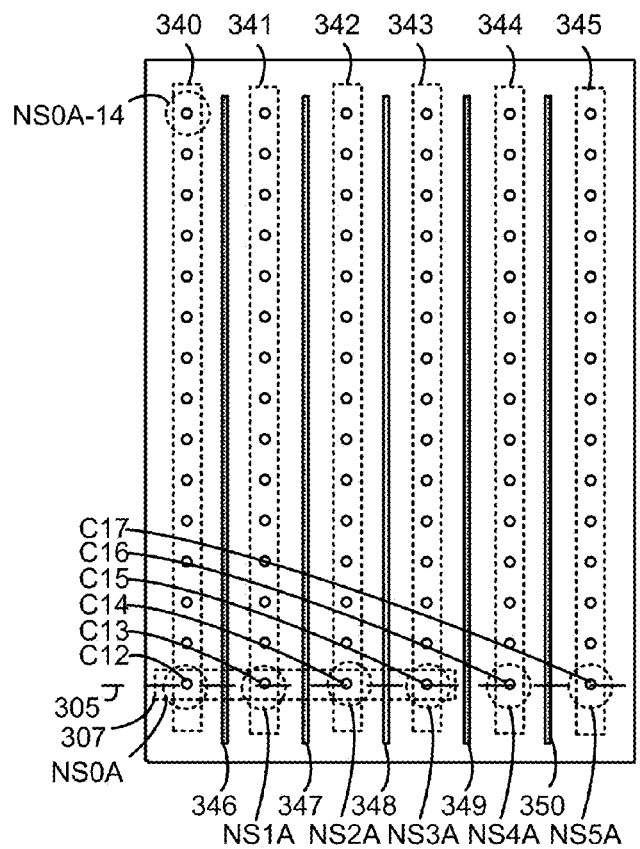
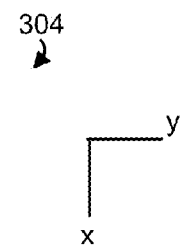
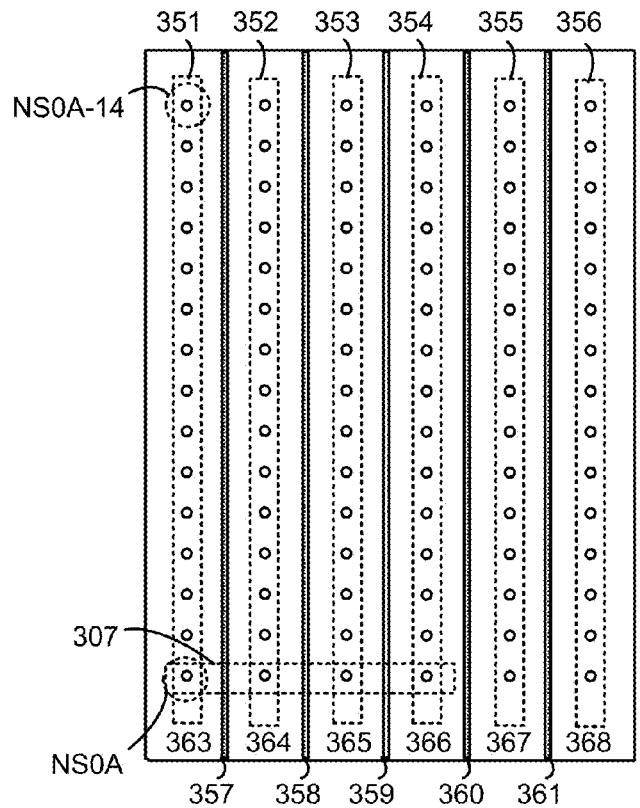
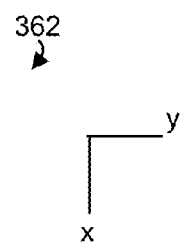

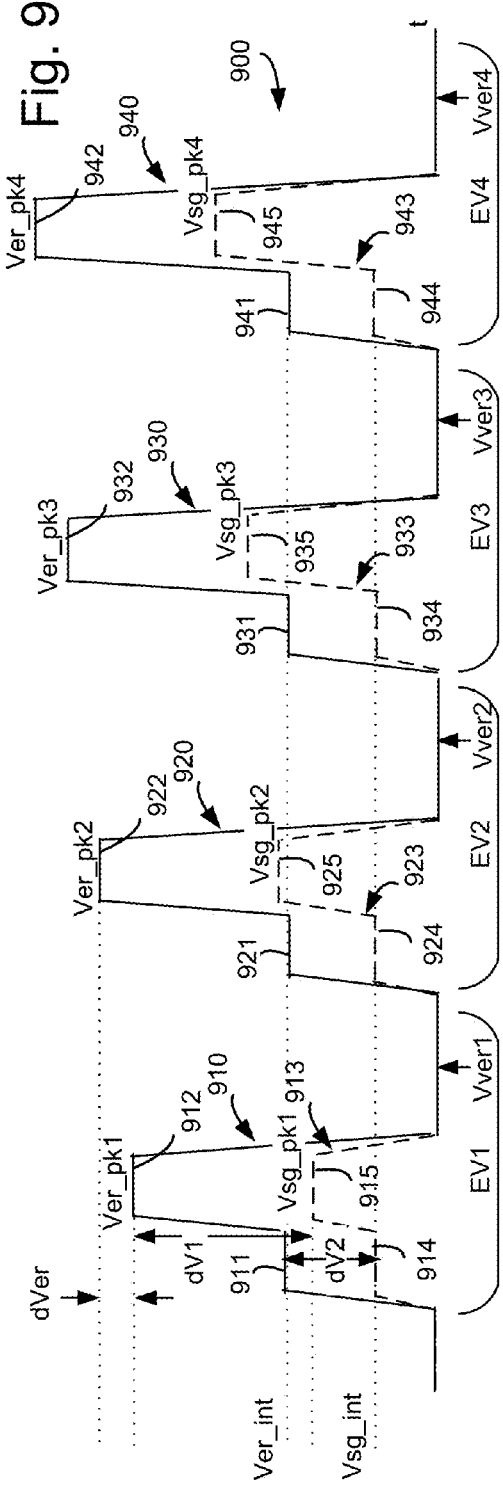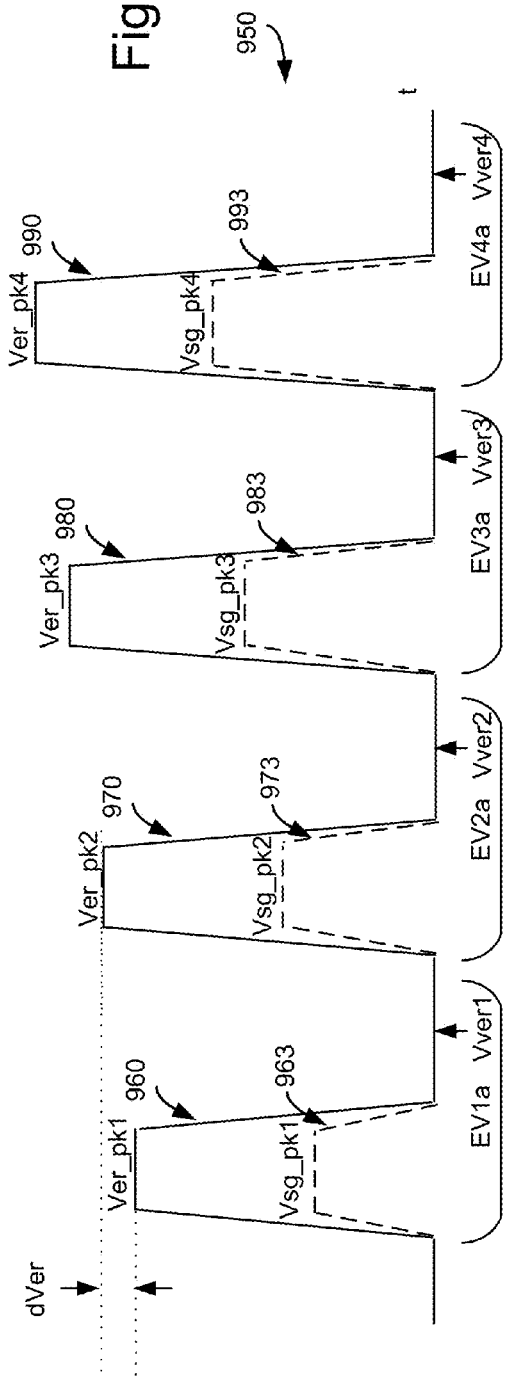

AVOIDING UNINTENTIONAL PROGRAM OR ERASE OF A SELECT GATE TRANSISTOR

BACKGROUND

The present technology relates to operation of memory devices.

Recently, ultra high density storage devices have been proposed using a three-dimensional (3D) stacked memory structure. One example is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe-or U-shaped NAND string (P-BiCS) includes a pair of vertical columns of memory cells which extend in two memory holes and which are joined by a bottom back gate. Control gates of the memory cells are provided by the conductive layers. However, various challenges are presented in operating such memory devices.

BRIEF DESCRIPTION OF THE DRAWINGS

Like-numbered elements refer to common components in the different figures.

FIG. 2A depicts a top view of example word line layers 202 and 204 in a U-shaped NAND embodiment, as an example implementation of BLK0 in FIG. 1A.

FIG. 2B depicts a top view of example select gate layer portions, consistent with FIG. 2A.

FIG. 3A depicts a top view of an example word line layer 304 of the block BLK0 of FIG. 1A, in a straight NAND string embodiment.

FIG. 3B depicts a top view of an example SGD layer 362, consistent with FIG. 3A.

FIG. 9A depicts an example erase operation in a multi-step embodiment.

FIG. 9B depicts an example erase operation in a single-step embodiment.

DETAILED DESCRIPTION

Figure 1A:
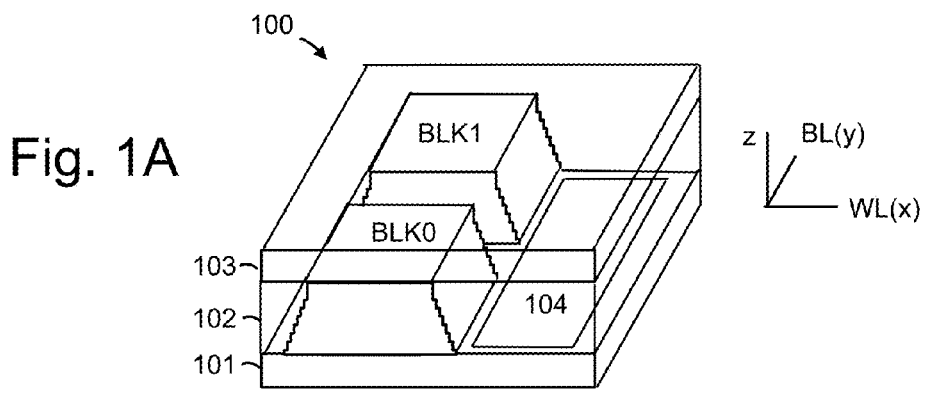
FIG. 1A is a perspective view of a 3D stacked non-volatile memory device.

Techniques are provided for preventing inadvertent program or erase of select gate transistors and dummy memory cells during an erase operation involving data-storing memory cells in a three-dimensional (3D) memory device.

In a 3D memory device, a stack of alternating conductive and dielectric layers are formed. Memory holes are etched in the stack and films are deposited in the holes such that memory cells or select gate transistors are formed where the conductive layers intersect with the memory holes. Some of the conductive layers are used as control gates for memory cells and other conductive layers are used as control gates for select gate transistors, such as drain or source side transistors in NAND strings. The memory cells are subject to operations such as programming, erasing and reading. An erase operation, in particular, can involve charging up a channel of the NAND string while floating the voltages of the control gates of the memory cells. This allows the voltages of the control gates of the memory cells to increase with the voltage of the channel due to coupling. The voltages of the control gates of the memory cells are then driven lower, such as to ground, generating an electric field which drives electrons out of a charge-trapping layer and into the channel, lowering the threshold voltages of the memory cells. This process can be repeated in multiple erase-verify iterations until the threshold voltages of the memory cells are below a desired level.

The charging up of the channel occurs due to gate-induced drain leakage (GIDL) of the select gate transistors at the drain and/or source ends of the NAND string. The select gate transistors are reversed biased, e.g., with a positive drain-to-gate voltage, which results in the generation of electron-hole pairs. For example, at the drain end of a NAND string, a bit line voltage (erase pulse) is applied which exceeds a voltage at the control gate of a drain-side select gate transistor by a few Volts. Similarly, at the source end of a NAND string, a source line voltage is applied which exceeds a voltage at the control gate of a source-side select gate transistor. The electrons are swept away by the electrical field and collected at the bit line and/or source line terminals; while holes will drift to the channel and help to charge up the channel. That is, the electrons will drift toward the high potential of the bit line or source line, while the holes will drift toward a low potential.

However, it takes some time for the holes to diffuse through the channel and increase the channel potential. As a result, at the beginning of each erase pulse, the gate-to-channel voltage of the select gate transistors is relatively high and this can result in inadvertent programming of the select gate transistors, e.g., by weak Fowler-Nordheim tunneling. Moreover, this problem becomes worse as the memory device accumulates program-erase cycles. The control gate voltage can be set at a lower level, but this can result in erasing of the select gate transistors when the channel is charged up, which is also undesirable. The threshold voltages of the select gate transistors should be within a specified range to enable the select gate transistors to be properly controlled.

In one aspect, a technique for preventing inadvertent program or erase of select gate transistors and dummy memory cells during an erase operation involving data-storing memory cells, includes ramping up voltages in an erase voltage waveform and a select gate waveform in two steps. The erase voltage waveform and the select gate waveform are provided concurrently at respective intermediate levels which allow some charging of the channel to occur. However, the intermediate level of the select gate waveform is not so high that the select gate transistors are programmed, in particular, at the start of the intermediate levels. Further, the intermediate level of the erase voltage waveform is not so high that the channel is charged up to a high level relative to the intermediate level of the select gate waveform to cause erasing of the select gate transistors at the end of the intermediate levels.

The erase voltage waveform and the select gate waveform are subsequently provided concurrently at respective peak voltages which allow further charging of the channel to occur while continuing to avoid programming or erasing of the select gate transistors. The erase voltage waveform and the select gate waveform are provided in multiple erase-verify iterations until the erase operation is completed. The intermediate levels can be fixed across all of the erase-verify iterations, while the peak levels are stepped up in each successive erase-verify iteration. In one approach, the peak levels of the erase voltage waveform and the select gate waveform are stepped up by a same increment to maintain a fixed difference between them, to avoid erasing the select gate transistors. Erasing of the select gate transistors can be avoided by avoiding an excessively high channel-to-gate voltage across the select gate transistors. Similarly, programming can be avoided by avoiding an excessively high gate-to-channel voltage.

In one approach, the intermediate levels of the erase voltage waveform and the select gate waveform can be based on a count of program-erase cycles or based on a measurement of the threshold voltages of the select gate transistors.

In one approach, the memory cells are erased using a single-step erase voltage waveform and select gate waveform until a specified count of program-erase cycles is reached or until the threshold voltages of the select gate transistors exceed a specified level. After either condition occurs, the memory cells are erased using a two-step erase voltage waveform and select gate waveform.

The following discussion provides details of the construction of example memory devices and of related techniques which address the above and other issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x-and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
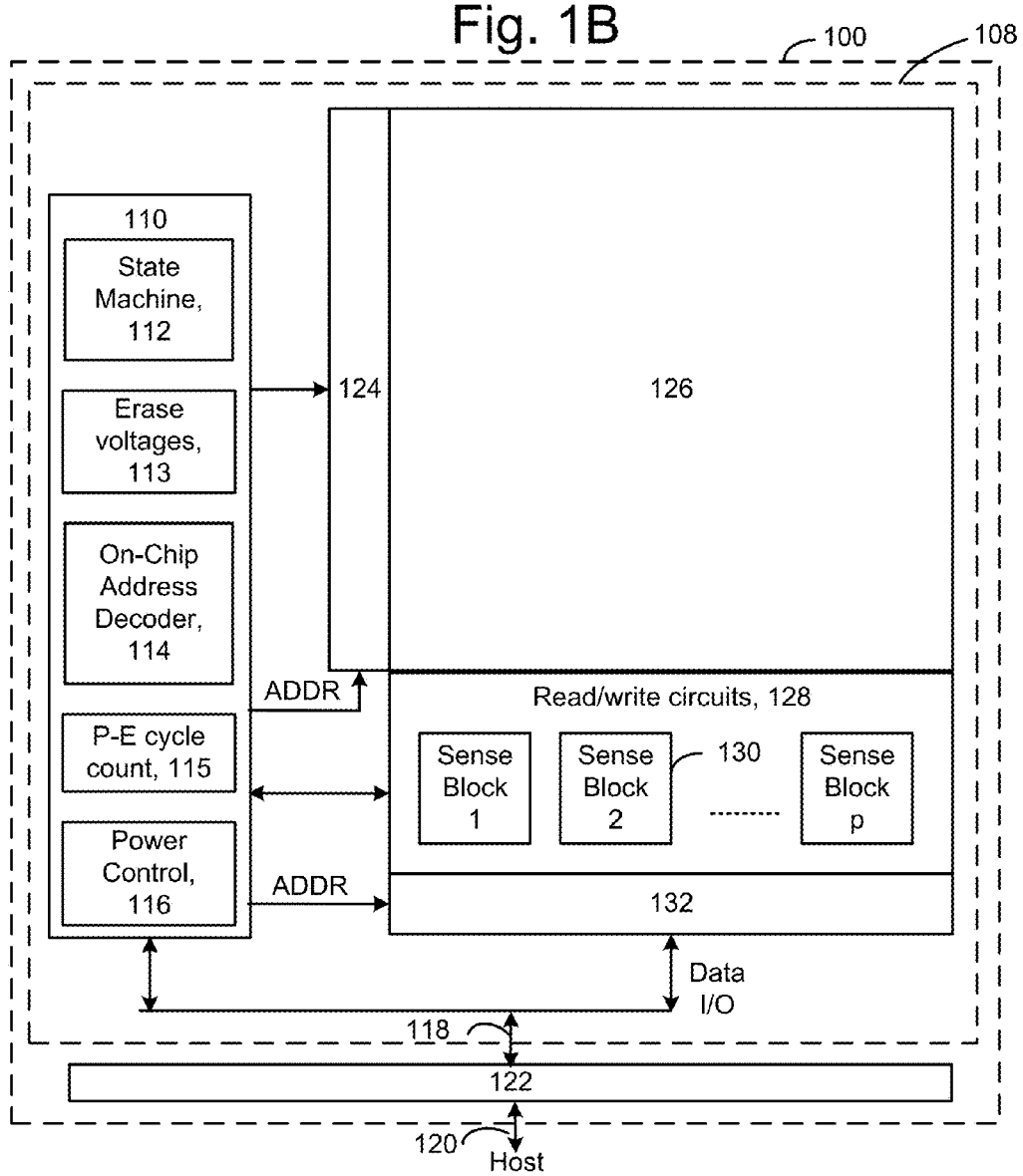
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The memory die 108 includes a memory structure 126 of memory cells, such as an array of cells, control circuitry 110, and read/write circuits 128. In a 3D configuration, the memory structure can include the blocks BLK0 and BLK1 of FIG. 1A. The memory structure 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for erase voltages in the memory device. For example, as discussed further below, this can include initial, intermediate and peak erase voltages and select gate voltages, step sizes, Vth_min and Vth_max (see, e.g., FIGS. 6B, 7B and 9A-9C). A storage region 115 may be provided for a count of program-erase cycles in the memory device (see, e.g., FIG. 6A).

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks 130 can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks 130, read/write circuits 128, and controller 122, and so forth.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate memory controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

Figure 2C:
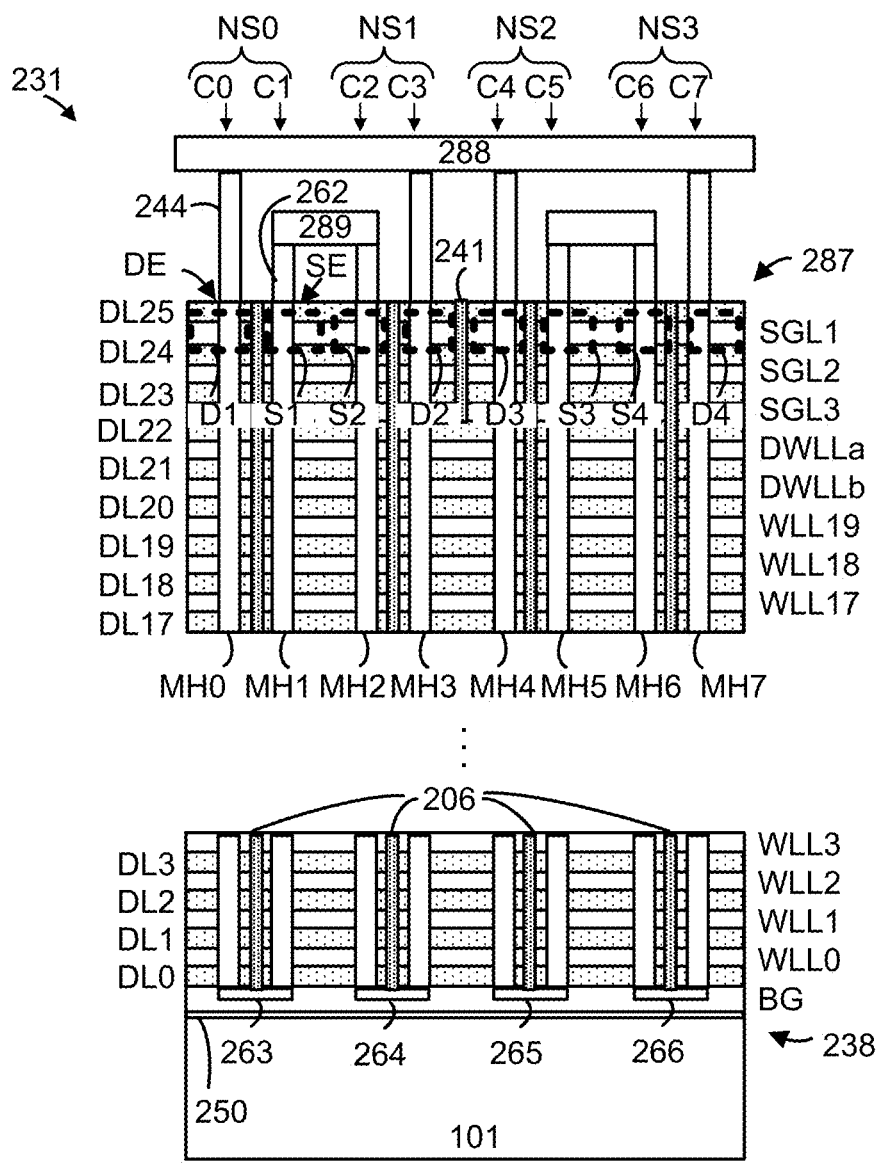
FIG. 2C depicts an embodiment of a stack 231 showing a cross-sectional view of the portion 209 of FIG. 2A, along line 220, where three select gate layers, SGL1, SGL2 and SGL3 are provided.

The view is of a representative layer among the multiple WLLs in a stack. Referring also to FIG. 2C, the stack includes alternating dielectric and conductive layers. The dielectric layers include DL0 to DL25 and may be made of SiO2, for instance. The conductive layers include a back gate layer (BGL), data-storing word line layers WLL0 to WLL19, dummy (non-data-storing) word line layers DWLLa and DWLLb, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain-and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32k memory columns in the x direction, for a total of 384,000 memory columns in a block. With U-shaped NAND strings, 192k NAND strings are provided in this example. With straight NAND strings, 384,000 NAND strings are provided in this example. Assuming there are twenty-four memory cells per column, there are 384,000× 24=9,216,000 memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD layer portions 216, 218, 219, 223, 224 and 226, respectively. Regions 253 and 254, 255 and 257, and 258 and 259 represent SGS transistors in SGS layer portions 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate layers of select gate transistors are formed in each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors in SGL1.

Figure 3C:
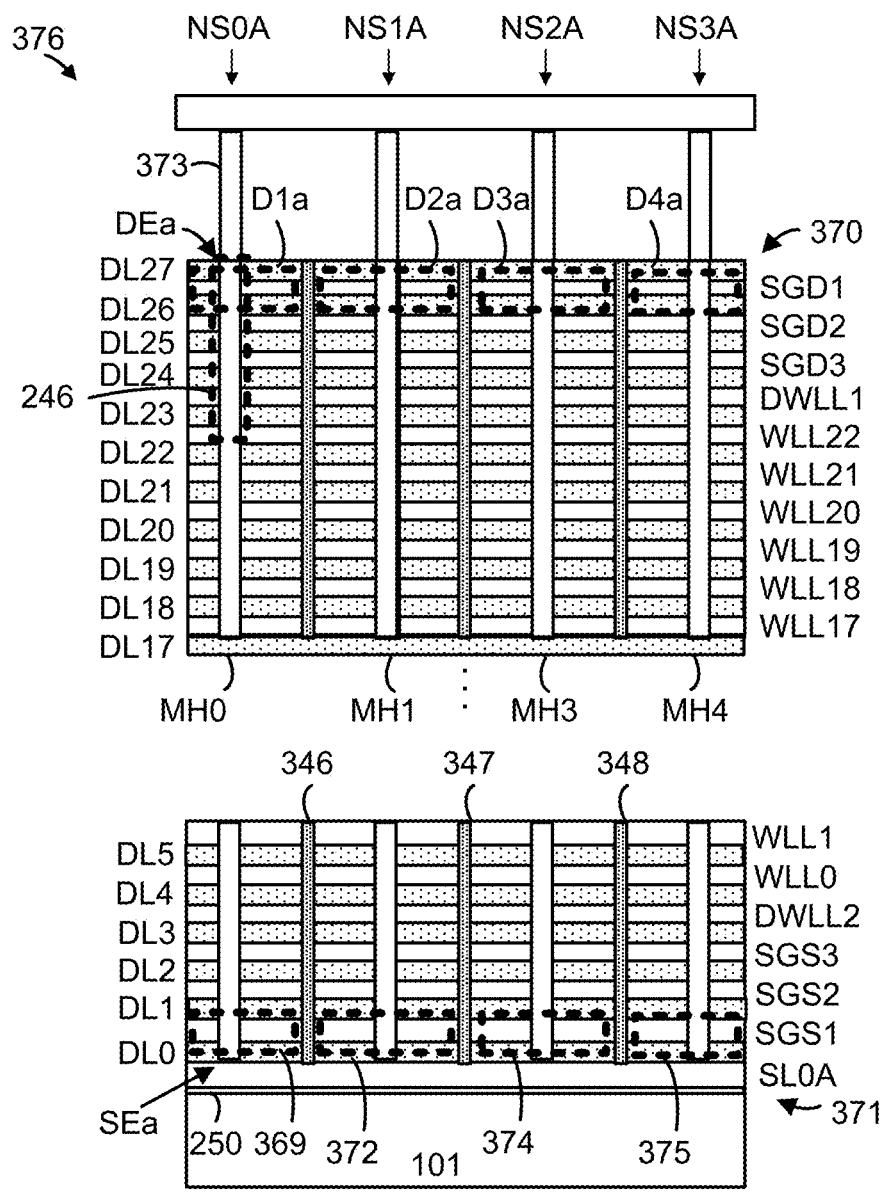
FIG. 3C depicts an embodiment of a stack 376 showing a cross-sectional view of the portion 307 of FIG. 3A, along line 305, where three SGD layers, three SGS layers and dummy word line layers DWLL1 and DWLL2 are provided.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C.

Regions 340, 341, 342, 343, 344 and 345 represent the memory cells (as circles) of respective sets of NAND strings. For example, region 340 represents memory cells in NAND strings NS0A, . . . , NS0A-14. Additional NAND strings include NS1A, NS2A, NS3A, NS4A and NS5A.

Alternatively, the layer 304 represents an SGS layer, in which case each circle represents an SGS transistor.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C depicts an embodiment of a stack 376 showing a cross-sectional view of the portion 307 of FIG. 3A, along line 305, where three SGD layers, three SGS layers and dummy word line layers DWLL1 and DWLL2 are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors 369, 372, 374 and 375 are formed in the SGS1 layer.

Figure 4A:
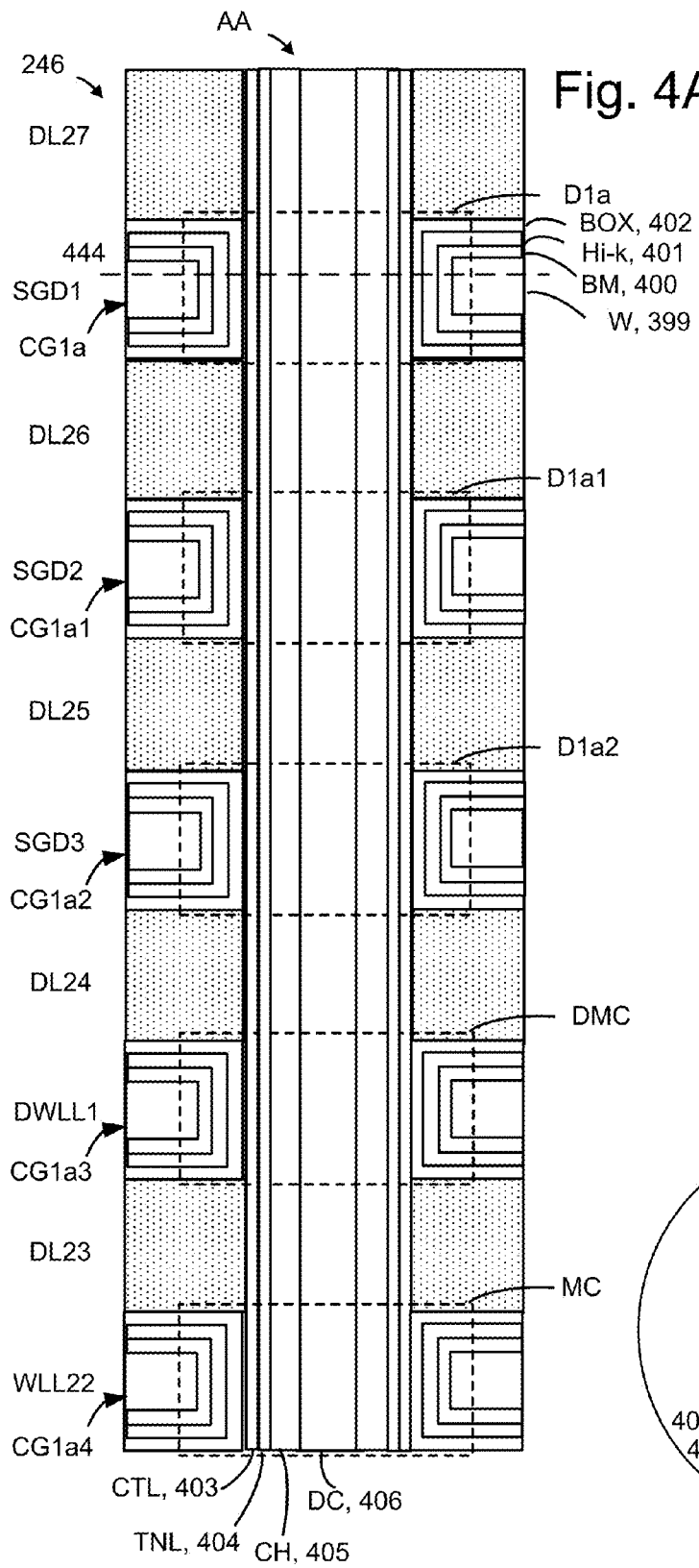
FIG. 4A depicts a view of the region 246 of FIG. 3C, showing SGD transistors D1a (consistent with FIG. 3C), D1a1 and D1a2 above a dummy memory cell (DMC) and a data-storing memory cell (MC).

A region 246 of the stack is shown in greater detail in FIG. 4A.

Regions D1a, D2a, D3a and D4a represent SGD transistors.

FIG. 4A depicts a view of the region 246 of FIG. 3C, showing SGD transistors D1a (consistent with FIG. 3C), D1a1 and D1a2 above a dummy memory cell (DMC) and a data-storing memory cell (MC). A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 403 such as SiN or other nitride, a tunnel oxide (TNL) 404, a polysilicon body or channel (CH) 405, and a dielectric core (DC) 406. A word line layer includes a block oxide (BOX) 402, a block high-k material 401, a barrier metal 400, and a conductive metal such as W 399 as a control gate. For example, control gates CG1a, CG1a1, CG1a2, CG1a3 and CG1a4 are provided for the SGD transistors D1a, D1a1 and D1a2, the dummy memory cell DMC and the memory cell MC, respectively. In another approach, all of these layers except the metal are provided in the column. Additional memory cells are similarly formed throughout the columns. The layers in the memory hole form a columnar active area (AA) of the NAND string.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors of an inhibited NAND string. In particular, to provide the select gate transistors in a non-conductive state, a relatively low voltage is applied to their control gates, resulting in a relatively lower amount of channel boosting in a region of the channel next to these select gate transistors. A region of the channel next to an edge cell will therefore also have a relatively lower amount of channel boosting. In contrast, the cells next to a non-edge cell can receive a relatively high pass voltage since these cells are provided in a conductive state, resulting in a relatively higher amount of channel boosting.

When a memory cell is programmed, electrons are stored in a portion of the CTL which is associated with the memory cell. These electrons are drawn into the CTL from the channel, and through the TNL. The Vth of a memory cell is increased in proportion to the amount of stored charge. During an erase operation, the electrons return to the channel.

Each of the memory holes can be filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

Figure 4B:
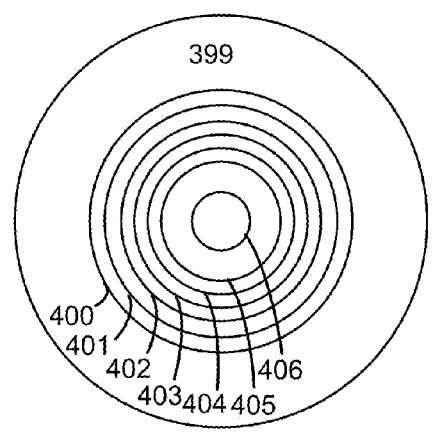
FIG. 4B depicts a cross-section view of the region 246 of FIG. 4A along line 444.

FIG. 4B depicts a cross-section view of the region 246 of FIG. 4A along line 444. Each layer is ring-shaped in one possible approach, except the core filler, which is a cylinder.

Figure 4C:
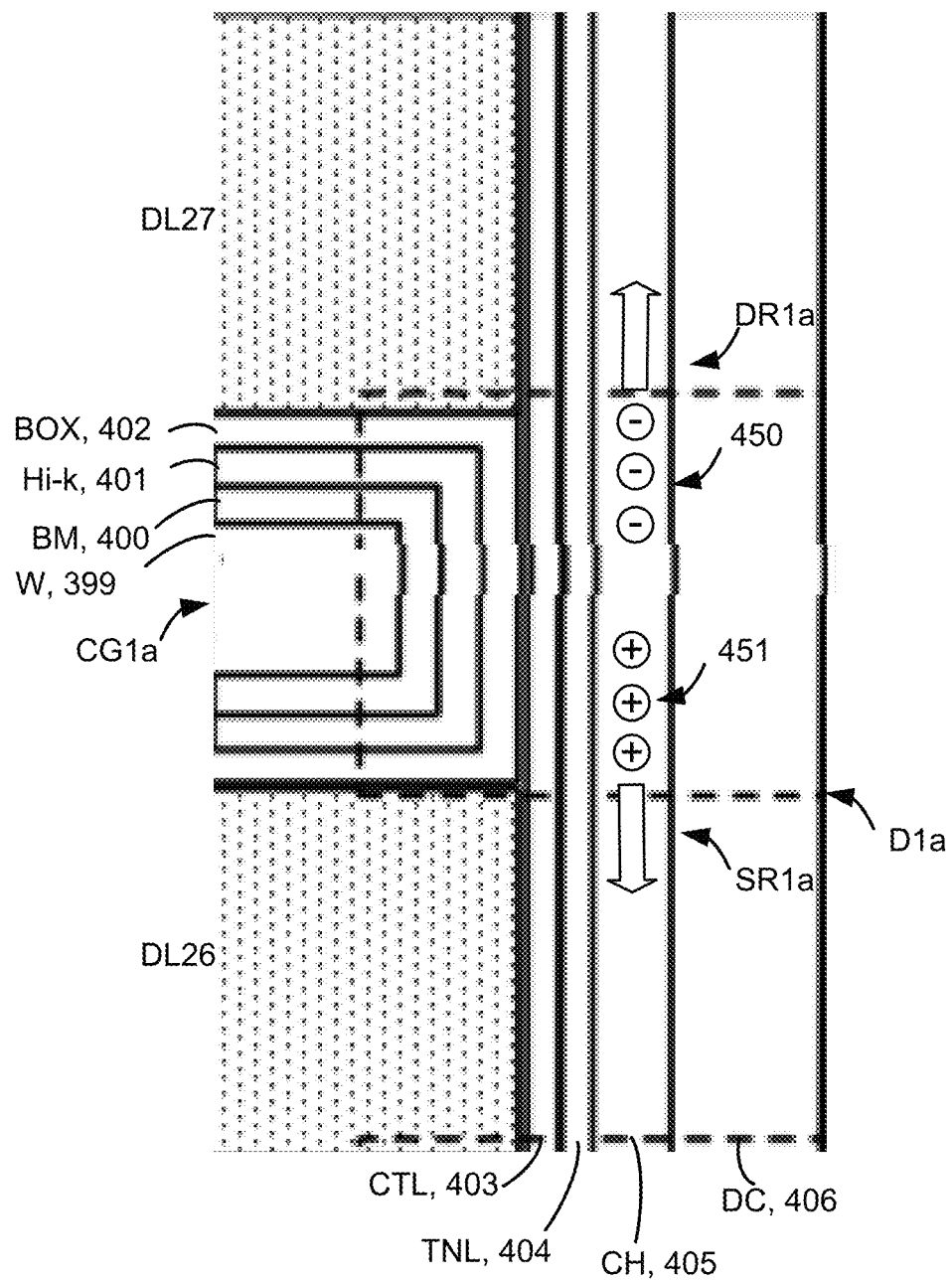
FIG. 4C depicts an expanded view of a portion of the SGD transistor D1a of FIG. 4A.

FIG. 4C depicts an expanded view of a portion of the SGD transistor D1a of FIG. 4A. As mentioned, GIDL results in the generation of electron-hole pairs, including example electrons 450 and holes 451. As indicated by the arrows, the electrons are attracted to the high erase voltage at the drain or source end of the NAND string while the holes are attracted to a lower potential region of the channel. When multiple select gate transistors are used at one end of a NAND string, each select gate transistor can generate a similar amount of GIDL. Additionally, one or more dummy memory cells can receive a bias which is similar to the bias of the select gate transistor and generate GIDL. A one-sided or two-sided erase may be used. In a one sided erase, one or more select gate transistors at the drain end of the NAND string, and optionally, one or more dummy memory cells at the drain end, are biased to generate GIDL. A two-sided erase augments the GIDL generated at the drain end by also biasing one or more select gate transistors at the source end of the NAND string, and optionally, one or more dummy memory cells at the source end, to generate GIDL. The SGD transistor D1a has a source side SR1a and a drain side DR1a.

The dummy memory cells and the select gate transistors have a threshold voltage which is kept within a fixed range.

Figure 5A:
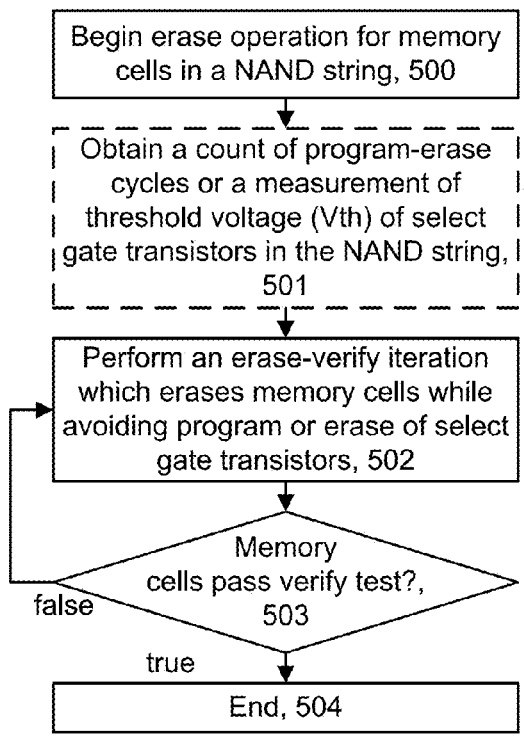
FIG. 5A depicts an example erase operation for memory cells which avoids program or erase of select gate transistors.

FIG. 5A depicts an example erase operation for memory cells which avoids program or erase of select gate transistors. Step 500 begins an erase operation for memory cells in a NAND string. For example, this can be in response to an erase command. Generally, one or more memory cells, e.g., data-storing memory cells, in one or more NAND strings, are selected to be erased by a control. For example, the data-storing memory cells of one or more word line layers may be selected to be erased together. Step 501 optionally obtains a count of program-erase cycles and/or a measurement of the threshold voltage (Vth) of select gate transistors in the NAND string. For a one-sided erase, the Vth of the SGD transistors is relevant. For a two-sided erase, the Vth of the SGS transistors is also relevant. The count or the measurement may indicate that there is an increased likelihood of inadvertently programming or erasing the select gate transistors such that a corrective action should be taken to reduce this likelihood. Step 502 involves performing an erase-verify iteration which erases the data-storing memory cells while avoiding program or erase of the select gate transistors.

An erase-verify iteration includes an erase portion followed by a verify portion. In the erase portion, the select gate transistors are biased to charge up the channel and the word lines of the selected memory cells are controlled to lower the Vth of the select memory cells toward a verify level. The verify portion includes a verify test. Decision step 503 determines if the memory cells pass the verify test. In the verify test, a sensing operation is performed in which a verify voltage (Vv_erase) is applied to the selected memory cells while a conductive state of the selected memory cells is determined. If the selected memory cells are in a conductive state, the verify test is passed. Their Vth is below the verify voltage and the erase operation is complete (step 504). If the selected memory cells are in a non-conductive state, the verify test is failed. Their Vth is above the verify voltage and the erase operation another erase-verify iteration is performed (step 502). Alternatively, a verify test may not be performed in some cases.

Figure 5B:
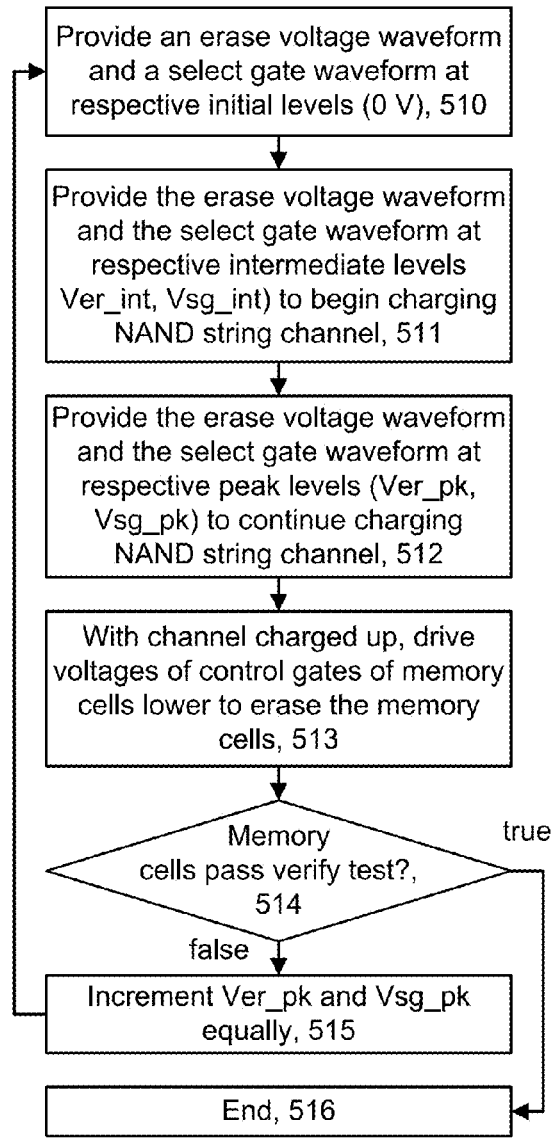
FIG. 5B depicts an example implementation of step 502 of the erase operation of FIG. 5A.
Figure 9C:
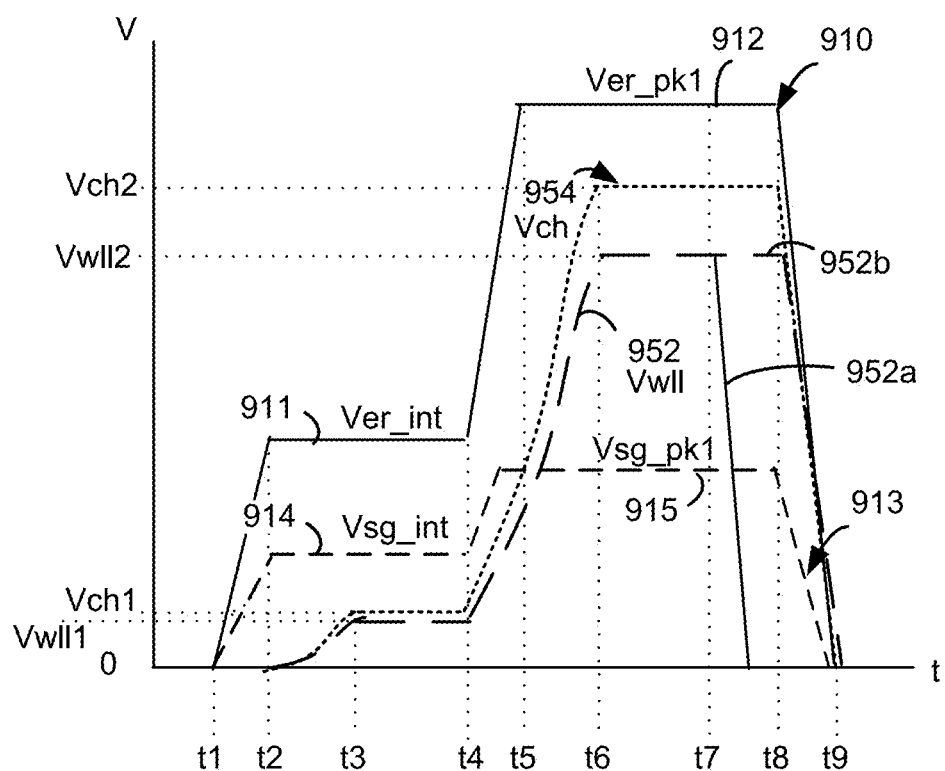
FIG. 9C depicts a view of the waveforms 910 and 913 of FIG. 9A in addition to a waveform 954 which represents a potential of a channel of a NAND string, and a waveform 952 which represents a potential of a control gate of a data-storing memory cell.

FIG. 5B depicts an example implementation of step 502 of the erase operation of FIG. 5A. Refer also to FIGS. 9A-9C. Step 510 provides an erase voltage waveform and a select gate waveform at respective initial levels (voltages) (e.g., 0 V). Step 511 provides the erase voltage waveform and the select gate waveform at respective intermediate levels (Ver_int and Vsg_int, respectively) to begin charging the NAND string channel. One consideration is that Vsg_init is not too high to program the select gate transistors. That is, the intermediate level of the select gate waveform is low enough in comparison to a potential of a channel of the NAND string to avoid programming of the select gate transistor.

Another consideration is that Ver_init is high enough compared to Vsg_int to begin to charge up the channel but is not so high that the channel is charged up to a level which causes erase of the select gate transistors are erased. That is, the intermediate level of the erase voltage waveform and the intermediate level of the select gate waveform provide a drain-to-gate voltage of the select gate transistor which causes the select gate transistor to generate holes in a channel of the NAND string by gate-induced drain leakage. The intermediate level of the erase voltage waveform is sufficiently higher than the intermediate level of the select gate waveform to cause the select gate transistor to generate holes in a channel of the NAND string, charging up the channel, but the channel is not charged up high enough in comparison to the intermediate level of the select gate waveform to erase the select gate transistor.

Step 512 provides the erase voltage waveform and the select gate waveform at respective peak levels (Ver_pk and Vsg_pk, respectively) to continue charging the NAND string channel. As before, one consideration is that Vsg_pk is not too high to program the select gate transistors. However, Vsg_pk can be greater than Vsg_int because the channel potential is higher when Vsg_pk is applied than when Vsg_int is applied (see Vch in FIG. 9C). Another consideration is that Ver_init is high enough compared to Vsg_int to continue to charge up the channel but is not so high that the channel is charged up to a level which causes erase of the select gate transistors are erased. That is, the peak level of the erase voltage waveform is sufficiently higher than the peak level of the select gate waveform to cause the select gate transistor to continue to generate holes in the channel to further charge up the channel, but the channel is not charged up high enough in comparison to the peak level of the select gate waveform to erase the select gate transistor.

At step 513, with the channel fully charged up, voltages of the control gates of the selected memory cells are driven lower (e.g., to 0 V) to erase the memory cells. In one approach, the voltages of the control gates of the selected memory cells are allowed to float higher in response to coupling from the channel before being driven lower. Decision step 514 determines if the memory cells have passed the verify test. If decision step 514 is true, the erase operation ends at step 516. If decision step 514 is false, step 515 increments Ver_pk and Vsg_pk equally, in one approach. Providing an equal increment maintains a fixed drain-to-gate voltage across the select gate transistors in the different erase-verify iterations so that GIDL can continue to be generated without erasing the select gate transistors.

Figure 5C:
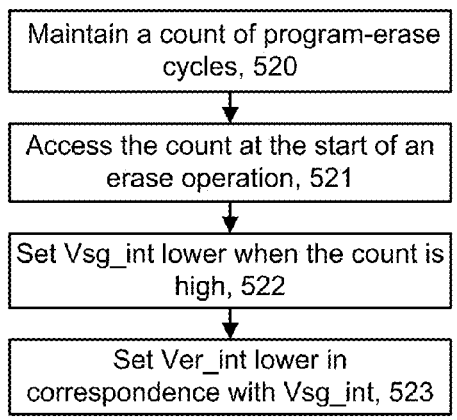
FIG. 5C depicts an example implementation of step 501 of the erase operation of FIG. 5A in which Vsg_int and/or Ver_int are adjusted based on a count of program-erase cycles.
Figure 6A:
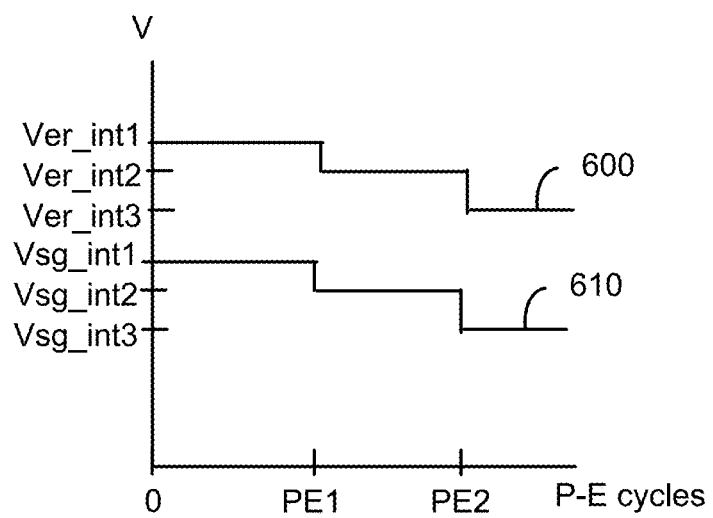
FIG. 6A is a plot of Ver_int and Vsg_int versus P-E cycles, consistent with steps 522 and 523 of FIG. 5C.

FIG. 5C depicts an example implementation of step 501 of the erase operation of FIG. 5A in which Vsg_int and/or Ver_int are adjusted based on a count of program-erase cycles. As a memory device accumulates more program-erase cycles, it becomes easier to program the select gate transistors (and the memory cells). The storage area 115 of FIG. 1B may be used to maintain the count, for instance. A controller such as the state machine can access the count and use it to adjust one or more voltages in an erase operation. The erase voltages may be stored in the storage area 113 of FIG. 1B. This approach can involve adjusting the voltages by predetermined amounts when predetermined milestones are reached in the count of program-erase cycles. Step 521 includes accessing the count at the start of an erase operation. Step 522 includes setting Vsg_int to a relatively lower level (e.g., lower than a level for a fresh memory device) when the count is relatively high, such as depicted in FIG. 6A, e.g., to avoid programming the select gate transistors. Step 523 includes setting Ver_int to a relatively lower level (e.g., lower than a level for a fresh memory device) in correspondence with the adjustment to Vsg_int such as depicted in FIG. 6A, e.g., to maintain a constant drain-to-gate voltage for the select gate transistors.

Figure 5D:
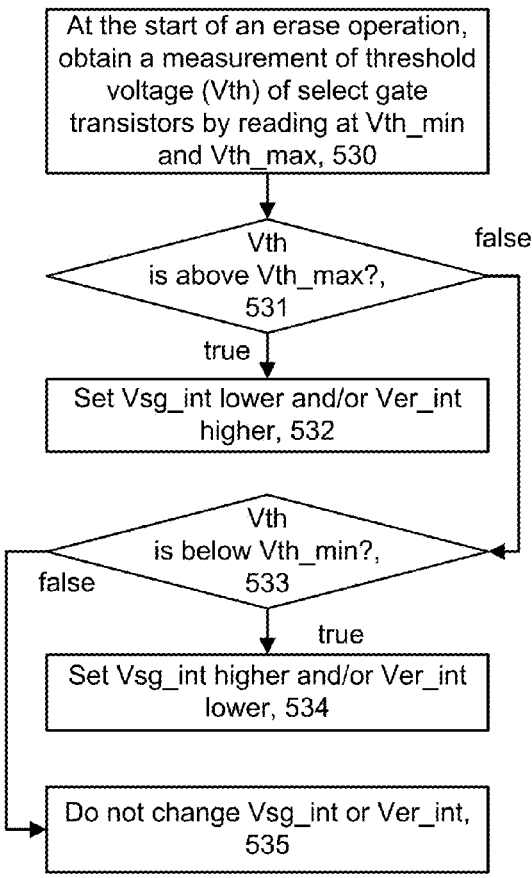
FIG. 5D depicts an example implementation of step 501 of the erase operation of FIG. 5A in which Vsg_int and/or Ver_int are adjusted based on a measurement of a threshold voltage of select gate transistors.

FIG. 5D depicts an example implementation of step 501 of the erase operation of FIG. 5A in which Vsg_int and/or Ver_int are adjusted based on a measurement of a threshold voltage of select gate transistors. This approach can involve adaptively deciding when to adjust the voltages based on measurements of the memory device. Each memory device can therefore be treated individually. At step 530, at the start of an erase operation, a measurement is obtained of the threshold voltage (Vth) of the select gate transistors by reading them at Vth_min, a minimum Vth in a range of acceptable values, and at Vth_max, a maximum Vth in the range of acceptable values.

Figure 7A:
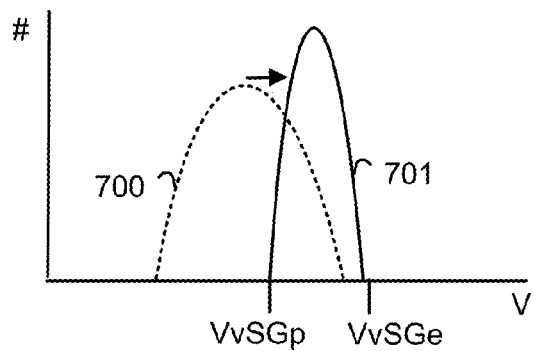
FIG. 7A depicts threshold voltage distributions during programming of select gate transistors which occurs prior to the erase operation of FIG. 5A.
Figure 7B:
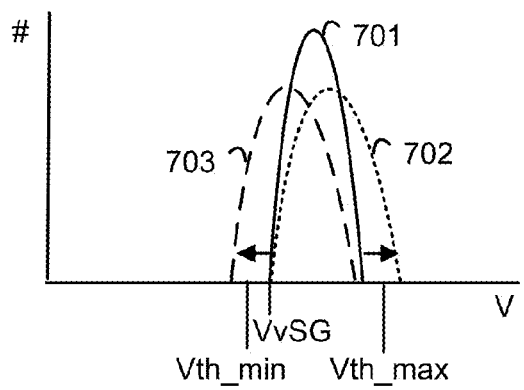
FIG. 7B depicts inadvertent program or erase of select gate transistors during erase of memory cells.

Referring to FIGS. 7A and 7B, the select gate transistors can be programmed from a Vth distribution 700 to a Vth distribution 701 using a verify voltage of VvSGp. FIG. 7A depicts threshold voltage distributions during programming of select gate transistors which occurs prior to the erase operation of FIG. 5A. FIG. 7B depicts inadvertent program or erase of select gate transistors during erase of memory cells. To ensure proper operation, the programming or erase of the select gate transistors can be done intentionally at the time of manufacture or periodically through the life of the memory device. A corresponding erase operation for the select gate transistors could also be performed using a verify voltage of VvSGe. This is done to keep the Vth within a range of acceptable values, e.g., Vth_min to Vth_max. If inadvertent programming of the select gate transistors occurs, the Vth distribution 701 can transition to the Vth distribution 702 in which some of the select gate transistors have a Vth that exceeds Vth_max. Inadvertent programming becomes more likely with cycling of the memory device. Inadvertent programming can also occur if a single-step erase pulse is used.

If inadvertent erasing of the select gate transistors occurs, the Vth distribution 701 can transition to the Vth distribution 703 in which some of the select gate transistors have a Vth that is below Vth_min.

In FIG. 5D, decision step 531 determines whether the Vth is above Vth_max. If decision step 531 is true, step 532 is used to set Vsg_int lower and/or Ver_int higher. The process then concludes. See FIG. 6B. Setting Vsg_int lower helps to avoid further programming of the select gate transistors. Setting Ver_int higher causes more channel boosting which can result in lowering the Vth by erasing the select gate transistors or at least in preventing further programming. If decision step 531 is false, decision step 533 determines whether Vth is below Vth_min. If decision step 533 is true, step 534 is used to set Vsg_int higher and/or Ver_int lower. The process then concludes. Setting Vsg_int higher helps to avoid further erasing of the select gate transistors and can even cause programming of the select gate transistors. Setting Ver_int lower causes less channel boosting which can result in increasing the Vth by allowing programming of the select gate transistors or at least in preventing further erasing. If decision step 533 is false, decision step 533 does not change Vsg_int or Ver_int.

A modification of the above approach is to measure at Vth_max but not at Vth_min if erasing of the select gate transistors is not expected.

A further modification is to perform multiple reads at the upper or lower ends of the range of acceptable Vth values. Based on the Vth interval that the Vth of a select gate transistor is in, a corresponding adjustment can be made. For example, if the Vth is slightly higher than Vth_max, a relatively small adjustment can be made at step 532. If the Vth is significantly higher than Vth_max, a relatively large adjustment can be made at step 532. Similarly, if the Vth is slightly lower than Vth_min, a relatively small adjustment can be made at step 534. If the Vth is significantly lower than Vth_max, a relatively large adjustment can be made at step 534.

A further modification is to count the number of select gate transistors having a Vth outside the range of acceptable Vth values (e.g., with Vth<Vth_min or Vth>Vth_max). The adjustment to the voltage can be greater when a relatively large number of the select gate transistors have a Vth outside the range of acceptable Vth values.

Generally, the measurement of the Vth can involve a set of select gate transistors which receive a common control gate voltage, where the Vth of each select gate transistor in the set can be independently measured. For example, this set could be the SGD transistors in any of the SGD layer portions 216, 218, 219, 223, 224 and 226, or the SGS transistors in any of the SGS layer portions 217, 221 and 225, respectively, in FIG. 2B. In another example, this set could be the SGD transistors in any of the SGD layer portions 363, 364, 365, 366, 367 and 368 in FIG. 3B. For example, each SGD transistor in the region 363 is connected to a separate bit line and can therefore be sensed independently of the other SGD transistors in the region 363. The voltages for each set of select gate transistors can therefore be set independently from other sets of select gate transistors in a block during an erase operation, even if the different sets receive a common bit line or source line voltage.

In a set of select gate transistors, some may have a Vth within the range of acceptable values and some may have a Vth outside the range of acceptable values. An adjustment which is based on the out-of-range select gate transistors will therefore be used as well for the in-range select gate transistors. However, this is acceptable since a majority of the select gate transistors will be close to being out-of-range if some of the select gate transistors are out-of-range, based on an expected Gaussian distribution of Vth in the set of select gate transistors.

Alternatively, the Vth is measured, and the voltages are set, for all of the select gate transistors in a block. In another approach, the Vth is measured, and the voltages are set, separately for select gate transistors in different select gate layers in a block. Voltages can also be set for the dummy memory cells in a similar way as for the select gate transistors.

Another option is to obtain the Vth measurement of step 530 at specified intervals of program-erase cycles rather than at the start of each erase operation. This approach saves time while still allowing for adaptive setting of the voltages. The select gate and erase voltages which are set at step 532 or 534 at the start of an interval of program-erase cycles can be fixed for a remainder of the interval.

Figure 5E:
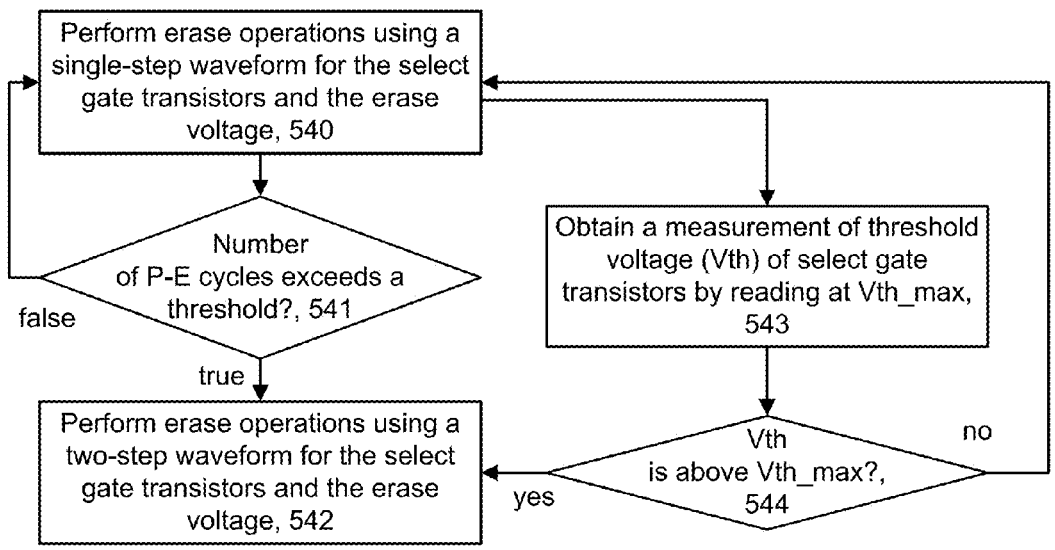
FIG. 5E depicts an example implementation of step 502 of the erase operation of FIG. 5A in which a multi-step waveform is used in place of a single-step waveform when a number of program-erase (P-E) cycles exceeds a threshold or when a threshold voltage of select gate transistors exceeds a specific level.

FIG. 5E depicts an example implementation of step 502 of the erase operation of FIG. 5A in which a multi-step waveform is used in place of a single-step waveform when a number of program-erase (P-E) cycles exceeds a threshold or when a threshold voltage of select gate transistors exceeds a specific level. In this approach, a single-step waveform (see, e.g., FIG. 9B) can be used while the memory device is relatively fresh. The single-step waveform can result in a shorter erase time since the peak erase voltage is applied sooner for each erase-verify iteration. Subsequently, the two-step waveform (see, e.g., FIG. 9A) can be used while the memory device is relatively cycled or based on a measurement of Vth. The two-step waveform helps avoid program and erase of the select gate transistors when it is most likely to occur.

Step 540 involves performing erase operations using a single-step waveform for the select gate transistors and the erase voltage. In one possible branch of the process, decision step 541 determines whether a number of P-E cycles exceeds a threshold. If decision step 541 is true, step 542 performs erase operations using a two-step waveform for the select gate transistors and the erase voltage. If decision step 541 is false, step 540 is used. In another possible branch of the process, step 543 obtains a measurement of the Vth of the select gate transistors by reading them using a verify level of Vth_max. Decision step 544 determines whether the Vth exceeds Vth_max, a maximum allowed level. If decision step 544 is true, step 542 is reached. If decision step 544 is false, step 540 is used.

Thus, in one approach, a prior erase operation uses a single-step waveform, a measurement obtained after the prior erase operation (e.g., erase operation 950 in FIG. 9B) and before one erase operation (e.g., erase operation 900 in FIG. 9A) indicates that a threshold voltage of the select gate transistor has increased above a maximum allowed level, and a decision is made to use the multi-step waveform in place of the single-step waveform in response to the measurement.

In a further approach, a prior erase operation uses a single-step waveform, a determination is made that a count of program-erase cycles of the three-dimensional memory device exceeds a specified level, and a decision is made to use the multi-step waveform in place of the single-step waveform in response to the determination.

FIG. 6A is a plot of Ver_int (600) and Vsg_int (610) versus P-E cycles, consistent with steps 522 and 523 of FIG. 5C. When the count of P-E cycles reaches certain specified levels, the intermediate voltages of the select gate waveform and the erase voltage waveform can be lowered. For example, when the count is between 0 and PE1 cycles, the intermediate voltages of the select gate waveform and the erase voltage waveform are Vsg_int1 and Ver_int1, respectively. When the count is between PE1 and PE2 cycles, the intermediate voltages of the select gate waveform and the erase voltage waveform are Vsg_int2 and Ver_int2, respectively. When the count is above PE2 cycles, the intermediate voltages of the select gate waveform and the erase voltage waveform are Vsg_int3 and Ver_int3, respectively. As discussed, providing a fixed increment between the intermediate voltages of the select gate waveform and the erase voltage waveform results in a fixed drain-to-gate voltage across the select gate transistors and therefore a uniform rate of GIDL generation. If the P-E checkpoints (e.g., PE1, PE2) are equally spaced, the reduction in the voltages can be larger for the later P-E checkpoints. The spaces between the checkpoints are PE1-0 and PE2-PE1. That is, Ver_int2-Ver_int3>Ver_int1-Ver_int2 and Vsg_int2-Vsg_int3>Vsg_int1-Vsg_int2. In another approach, the spacing between the P-E cycles increase and the reduction in the voltages is equal for each checkpoint. That is, Ver_int2-Ver_int3=Ver_int1-Ver_int2 and Vsg_int2-Vsg_int3=Vsg_int1-Vsg_int2.

Figure 6B:
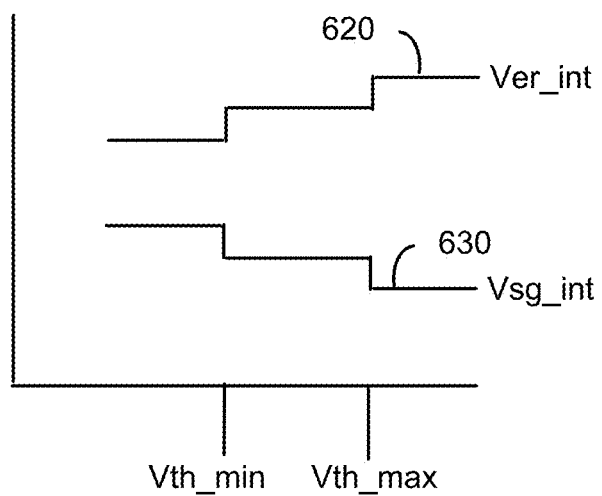
FIG. 6B is a plot of Ver_int and Vsg_int versus P-E cycles, consistent with steps 532 and 534 of FIG. 5D.

FIG. 6B is a plot of Ver_int (620) and Vsg_int (630) versus P-E cycles, consistent with steps 532 and 534 of FIG. 5D. When the Vth of a set of select gate transistors is below Vth_min, this indicates the select gate transistors are being inadvertently erased. A corrective measure is to increase Vsg_int and/or lower Ver_int. When the Vth of a set of select gate transistors is above Vth_max, this indicates the select gate transistors are being inadvertently programmed. A corrective measure is to decrease Vsg_int and/or increase Ver_int.

FIGS. 7A and 7B were discussed above in connection with FIG. 5D.

Figure 7C:
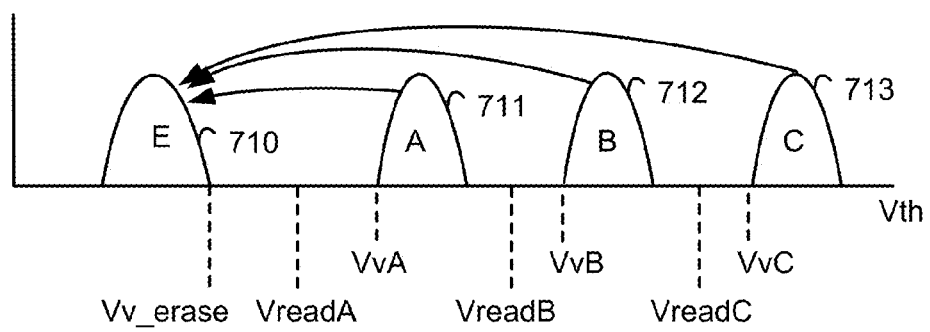
FIG. 7C depicts threshold voltage distributions of memory cells in an erase operation, consistent with step 502 of FIG. 5A.

FIG. 7C depicts threshold voltage distributions of memory cells in an erase operation, consistent with step 502 of FIG. 5A. The horizontal axis depicts Vth and the vertical axis depicts a number of memory cells. The memory cells initially have Vth distributions 710, 711, 712 and 713 in the E, A, B and C states. The memory cells with the A, B and C state distributions are erased using a verify level of Vv_erase. Read levels of VreadA, VreadB and VreadC are also depicted.

Figure 8:
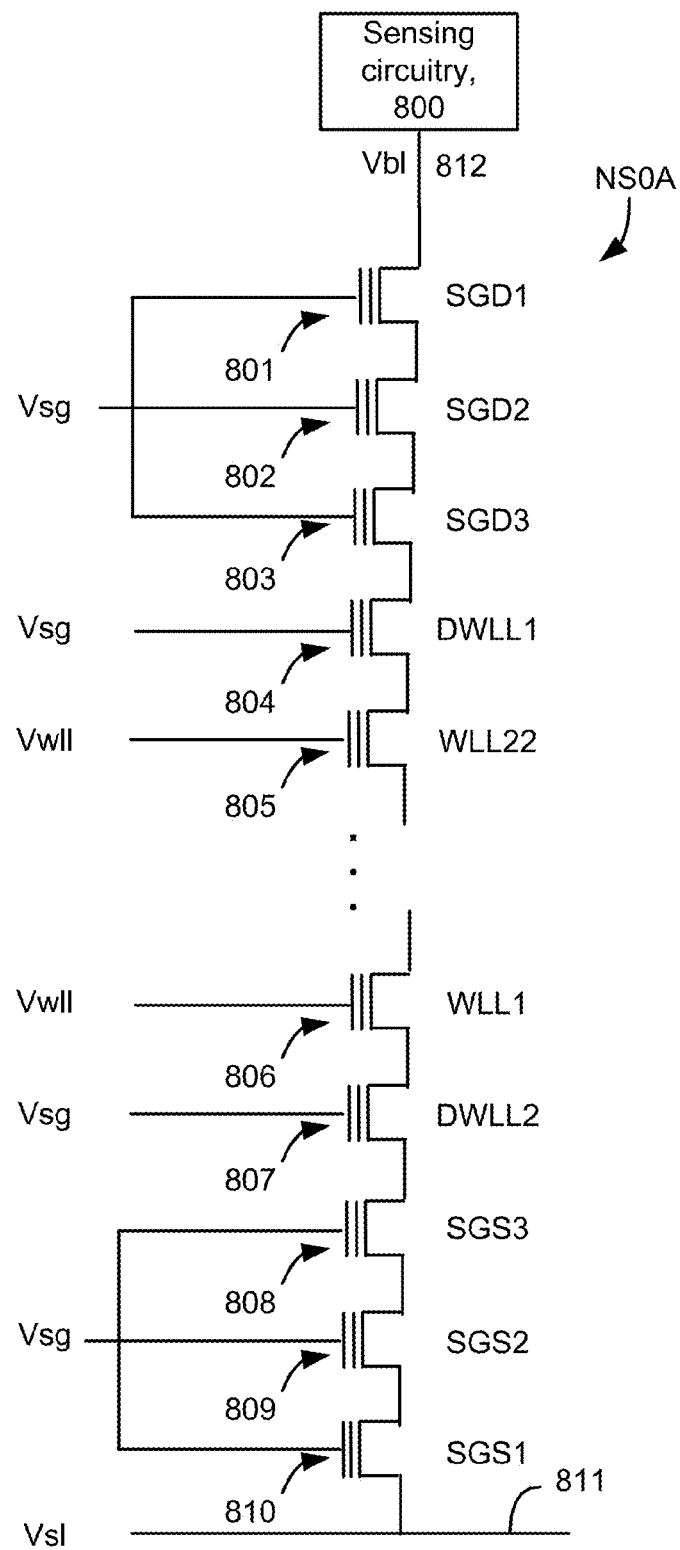
FIG. 8 depicts a circuit diagram of a NAND string consistent with the memory devices of FIGS. 2C and 3C.

FIG. 8 depicts a circuit diagram of a NAND string consistent with the memory devices of FIGS. 2C and 3C. An example NAND string NS0A, consistent with FIG. 3C (or NS0 consistent with FIG. 2C), includes SGD transistors 801, 802 and 803, a drain-side dummy memory cell 804, data-storing memory cells 805, . . . , 806, a source-side dummy memory cell 807, and SGS transistors 808, 809 and 810. A bit line 812 connects the drain end of the NAND string to sensing circuitry 800, which is used to sense the NAND string during operations involving the select gate transistors and the memory cells. A source line 811 is connected to a source end of the NAND string. Voltage drivers can be used to provide the voltages depicted. For example, Vsg is applied to the control gates of the SGD transistors, which are connected to one another and to the control gates of the SGS transistors, which are connected to one another. Vsg can also be applied to the dummy memory cells 804 and 807. A common word line voltage Vwl1 is applied to each of the data-storing memory cells, in this example. Vb1 is the bit line voltage and Vs1 is the source line voltage.

FIG. 9A depicts an example erase operation in a multi-step embodiment. The erase operation 900 comprises a series of program-erase iterations EV1, EV2, EV3 and EV4. Four erase-verify iterations are shown as an example. One or more can be used. In the first erase-verify iteration EV1, an erase voltage waveform 910 is applied to a bit line and/or source line of each selected NAND string (e.g., each NAND string which has one or more memory cells to be erased), and a select gate waveform 913 is applied to the select gate transistors. The erase voltage waveform 910 has an initial level of 0 V, a portion 911 with an intermediate level of Ver_int and a portion 912 with a peak level of Ver_pk1. The select gate waveform 913 has an initial level of 0 V, a portion 914 with an intermediate level of Vsg_int and a portion 915 with a peak level of Vsg_pk1. A difference between Vsg_int and Ver_int is dV2. A difference between Vsg_pk1 and Ver_pk1 is dV1. A step size for the erase voltage waveform is dVer.

In the second erase-verify iteration EV2, an erase voltage waveform 920 has an initial level of 0 V, a portion 921 with an intermediate level of Ver_int and a portion 922 with a peak level of Ver_pk2. The select gate waveform 923 has an initial level of 0 V, a portion 924 with an intermediate level of Vsg_int and a portion 925 with a peak level of Vsg_pk2, where Ver_pk2-Vsg_pk2=dV1.

In the third erase-verify iteration EV3, an erase voltage waveform 930 has an initial level of 0 V, a portion 931 with an intermediate level of Ver_int and a portion 932 with a peak level of Ver_pk3. The select gate waveform 933 has an initial level of 0 V, a portion 934 with an intermediate level of Vsg_int and a portion 935 with a peak level of Vsg_pk3, where Ver_pk3-Vsg_pk3=dV1.

In the fourth erase-verify iteration EV4, an erase voltage waveform 940 has an initial level of 0 V, a portion 941 with an intermediate level of Ver_int and a portion 942 with a peak level of Ver_pk4. The select gate waveform 943 has an initial level of 0 V, a portion 944 with an intermediate level of Vsg_int and a portion 945 with a peak level of Vsg_pk4, where Ver_pk4-Vsg_pk4=dV1.

Further, verify operations Vver1, Vver2, Vver3 and Vver4 are performed in the erase-verify iterations EV1, EV2, EV3 and EV4, respectively. During a verify (read) operation for a memory cell, a verify voltage (Vv_erase) is applied to the control gates of the data-storing memory cells while a bit line voltage is supplied using sensing circuitry. The select gate transistors and dummy memory cells are provided in a conductive state and act as pass gates. A decay in the bit line voltage is measured. A substantial decay, below a threshold at a specified time, indicates the Vth of the data-storing memory cell is below Vv_erase and the memory cell is in a conductive state. If the bit line voltage remains above the threshold, the Vth of the data-storing memory cell is above Vv_erase and the memory cell is in a non-conductive state.

Generally, each erase voltage waveform is among a plurality of erase voltage waveforms in the erase operation, the plurality of erase voltage waveforms have respective peak levels which increase incrementally over the erase operation, the select gate waveform is among a plurality of select gate waveforms in the erase operation, and the plurality of select gate waveforms have respective peak levels which increase incrementally over the erase operation. The respective peak levels of the plurality of erase voltage waveforms may exceed the respective peak levels of the plurality of select gate waveforms by a fixed amount (dV1). The intermediate level of the erase voltage waveform (Ver_int) may be common to each erase voltage waveform of the plurality of erase voltage waveforms, and the intermediate level of the select gate waveform (Vsg_int) is common to each select gate waveform of the plurality of select gate waveforms.

The unselected NAND strings can be inhibited from being erased by allowing the voltages of the select gate transistors to float, for instance, so that their channels are not charged up.

Note that while two-step waveforms are provided, other variations are possible. For example, generally, a multi-step waveform comprising two or more steps can be used. In another variation, the waveforms comprise ramps instead of, or in addition to, steps.

FIG. 9B depicts an example erase operation in a single-step embodiment. The erase operation 950 comprises a series program-erase iterations EV1a, EV2a, EV3a and EV4a. In the first erase-verify iteration EV1a, an erase voltage waveform 990 is applied to a bit line and/or source line of each selected NAND string, and a select gate waveform 963 is applied to the select gate transistors. The erase voltage waveform 960 has an initial level of 0 V and a portion with a peak level of Ver_pk1. The select gate waveform 963 has an initial level of 0 V and a portion with a peak level of Vsg_pk1. A step size for the erase voltage waveform is dVer.

In the second erase-verify iteration EV2a, the erase voltage waveform 970 has an initial level of 0 V and a portion with a peak level of Ver_pk2. The select gate waveform 973 has an initial level of 0 V and a portion with a peak level of Vsg_pk2.

In the third erase-verify iteration EV3a, the erase voltage waveform 980 has an initial level of 0 V and a portion with a peak level of Ver_pk3. The select gate waveform 983 has an initial level of 0 V and a portion with a peak level of Vsg_pk3.

In the fourth erase-verify iteration EV4a, the erase voltage waveform 990 has an initial level of 0 V and a portion with a peak level of Ver_pk4. The select gate waveform 993 has an initial level of 0 V and a portion with a peak level of Vsg_pk4.

Further, verify operations Vver1, Vver2, Vver3 and Vver4 are performed in the erase-verify iterations EV1a, EV2a, EV3a and EV4a, respectively.

FIG. 9C depicts a view of the waveforms 910 and 913 of FIG. 9A in addition to a waveform 954 which represents a potential of a channel (Vch) of a NAND string, and a waveform 952 which represents a potential of a control gate or word line (Vw11) of a data-storing memory cell. The horizontal axis depicts time and the vertical axis depicts voltage. Before t1, the waveforms are at 0 V. From t1-t2, the erase voltage waveform is increased to Ver_int and the select gate waveform is increased to Vsg_int. At this time, GIDL begins to occur in proportion to the drain-to-gate voltage (Ver_int-Vsg_int) of the select gate transistors. Between t2 and t3, the channel is charged up to a relatively constant level of Vch1. In this time period, Vch is close to 0 V, so that the gate-to-channel voltage across the select gate transistors is at a maximum level. However, since Vsg is at the intermediate level of Vsg_int, the gate-to-channel voltage is not sufficient to program the select gate transistors.

Between t3 and t4, the Vch remains at Vch1. Vw11 is coupled up by Vch to an initial level of Vwll1, which is slightly below Vch1.

Between t4 and t5, the select gate waveform is increased to Vsg_pk1 and the erase voltage waveform is increased to Ver_pk1. Between t5 and t8, the select gate waveform remains at Vsg_pk1 and the erase voltage waveform remains at Ver_pk1. The drain-to-gate voltage (Ver_pk1-Vsg_pk1) of the select gate transistors is higher than during t2-t4 so that Vch increases to a peak level of Vch2 which is slightly below Ver_pk1. Vw11 is coupled up by Vch to a peak level of Vwl12, which is slightly below Vch2.

For the selected word lines, waveform portion 952a indicates that the word line voltage is driven lower, e.g., to 0 V, driving electrons out of the charge trapping layer and into the channel, thus erasing the associated memory cells. For the unselected word lines, waveform portion 952b indicates that the word line voltage remains floating at Vwl12 so that no erasing occurs for the associated memory cells.

Between t8 and t9, the select gate waveform and the erase voltage waveform are reduced to 0 V. Vch and Vw11 follow to 0 V.

In this example, an initial drain-to-gate voltage of the select gate transistor (Ver_int-Vsg_int) (e.g., one drain-to-gate voltage) exceeds a first level but not a second level. Subsequently, additional charging up of the channel is performed using GIDL from the select gate transistor, where the additional charging up comprises providing an additional drain-to-gate voltage of the select gate transistor (Ver_pk1-Ver_sg1) which exceeds the second level (and the one drain-to-gate voltage). For example, Ver_int-Vsg_int may be 10−5=5 V, and Ver_pk1-Ver_sg1 may be 18−9=9 V.

Figure 10:
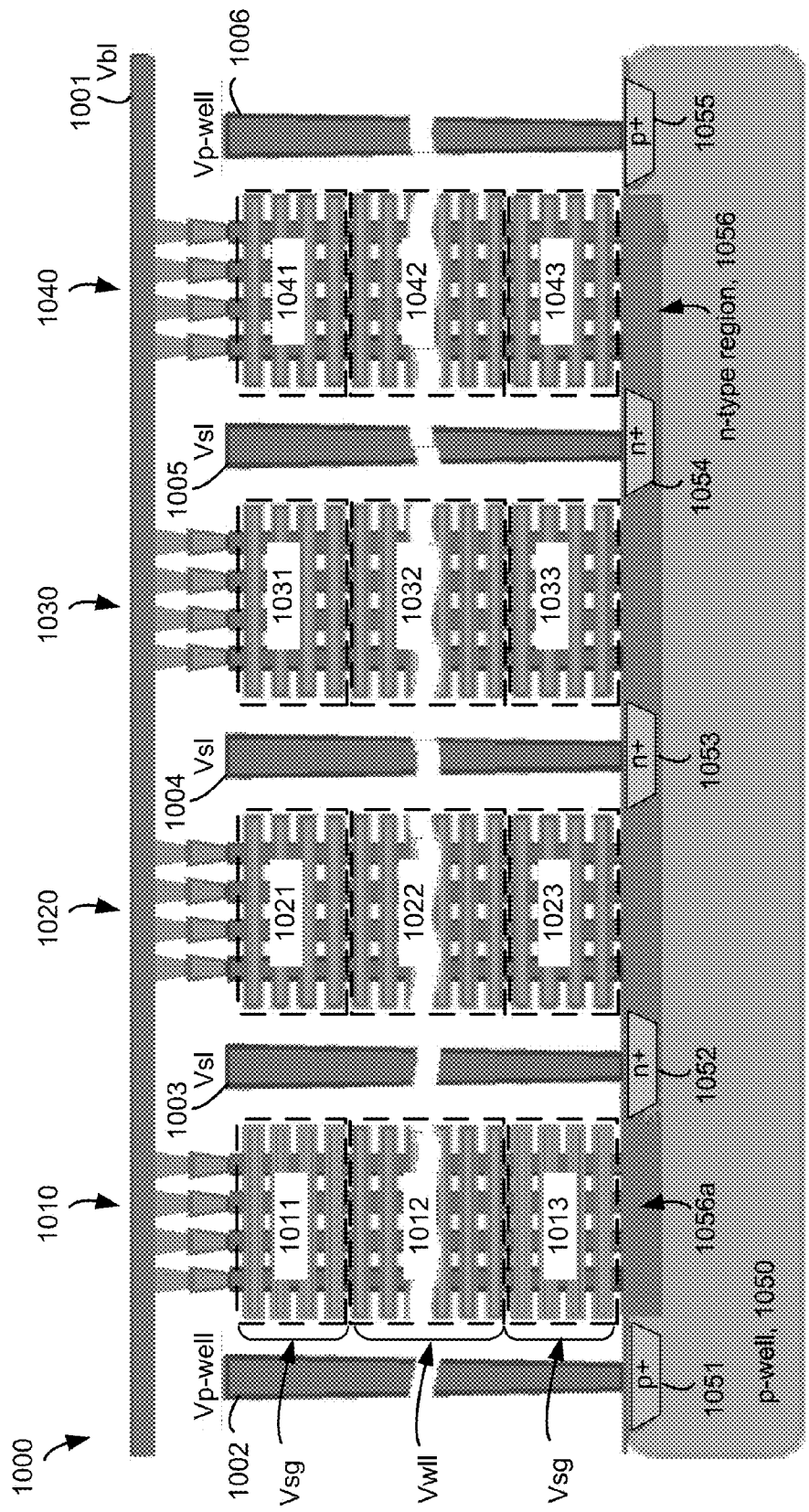
FIG. 10 depicts an example configuration of a memory device during an erase operation.

FIG. 10 depicts an example configuration of a memory device 1000 during an erase operation. The memory device is arranged in groups 1010, 1020, 1030 and 1040. Each group includes a top portion comprising drain-side select gate transistors and dummy memory cells, a middle portion comprising data-storing word lines and a bottom portion comprising source-side select gate transistors and dummy memory cells. Groups 1010, 1020, 1030 and 1040 include top portions 1011, 1021, 1031 and 1041, respectively, middle portions 1012, 1022, 1032 and 1042, respectively, and bottom portions 1013, 1023, 1033 and 1043, respectively. In this example, group 1010 is selected for erase, so that Vsg is applied to each control gate in the top portion 1011 and bottom portion 1013 and Vw11 is applied to each control gate in the middle portion 1012. Groups 1020, 1030 and 1040 are not selected for erase, so that the select gate transistors and dummy memory cells can be in a non-conductive state, with 0 V on their control gates, or with floating voltages, for example.

The groups are formed on a p-well 1050 of a substrate, where the p-well includes p+ regions 1051 and 1055 connected to vias 1002 and 1006, respectively, which receive a voltage Vp-well. The p-well also includes n+ regions 1052, 1053 and 1054 connected to vias 1003, 1004 and 1005, respectively, which receive a source line voltage Vs1. A top portion 1056 of the p-well may be doped n-type to improve cell current. For example, a portion 1056a of the n-type region provide a current path between the source ends of the NAND strings in the group 1010 and the via 1003. In this situation, GIDL current has to be generated from within the channel of the NAND strings. Controlling the erase voltage waveform and the select gate waveform as described herein allows the GIDL to be generated while avoiding inadvertent program or erase of the select gate transistors.

Accordingly, it can be seen that, in one embodiment, a method for erasing in a memory device comprises: applying an erase voltage waveform to an end of a NAND string in a three-dimensional memory device in connection with an erase operation involving one or more memory cells of the NAND string, the erase voltage waveform comprises an initial level followed by an intermediate level and then a peak level; and applying a select gate waveform to a control gate of a select gate transistor in the NAND string, the select gate waveform comprises an initial level which is concurrent with the initial level of the erase voltage waveform followed by an intermediate level which is concurrent with the intermediate level of the erase voltage waveform and then a peak level which is concurrent with the peak level of the erase voltage waveform, the intermediate level of the erase voltage waveform is higher than the intermediate level of the select gate waveform, and the peak level of the erase voltage waveform is higher than the peak level of the select gate waveform.

In another embodiment, a memory device comprises: a NAND string comprising one or more memory cells and a select gate transistor, the select gate transistor is at one end of the NAND string; and a control circuit. The control circuit, to erase the one or more memory cells in an erase operation is configured to: apply an initial voltage followed by an intermediate voltage and then a peak voltage to the one end; and apply an initial voltage followed by an intermediate voltage and then a peak voltage to a control gate of the select gate transistor, the initial voltage applied to the one end is concurrent with the initial voltage applied to the control gate of the select gate transistor, the intermediate voltage applied to the one end is concurrent with and greater than the intermediate voltage applied to the control gate of the select gate transistor, and the peak voltage applied to the one end is concurrent with and greater than the peak voltage applied to the control gate of the select gate transistor.

In another embodiment, a method for erasing in a memory device comprises: performing initial charging up a channel of a NAND string in a three-dimensional memory device using gate-induced drain leakage from a select gate transistor of the NAND string, the initial charging up comprises providing an initial drain-to-gate voltage of the select gate transistor which exceeds a first level but not a second level; performing additional charging up the channel using gate-induced drain leakage from the select gate transistor, the additional charging up comprises providing an additional drain-to-gate voltage of the select gate transistor which exceeds the second level; and while the channel is charged up in response to the initial charging up and the additional charging up, floating and then driving lower a control gate voltage of one or more memory cells of the NAND string.

In another embodiment, a memory device comprises: a NAND string comprising one or more memory cells and a select gate transistor, the select gate transistor is at one end of the NAND string; and a control circuit. The control circuit, to control the select gate transistor during an erase operation, is configured to: apply an erase voltage waveform to the one end; and during the erase voltage waveform, apply an initial voltage followed by an intermediate voltage and then a peak voltage to a control gate of the select gate transistor.

In another embodiment, a memory device comprises: a set of series-connected transistors comprising memory cells and a select gate transistor; and a control circuit. The control circuit, to perform an erase operation for one or more of the memory cells: biases the select gate transistor with one drain-to-gate voltage and then biases the select gate transistor with an additional drain-to-gate voltage which is higher than the initial drain-to-gate voltage.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for erasing in a memory device, comprising:
   in an erase-verify iteration:
      applying an erase voltage waveform to an end of a NAND string in a three-dimensional memory device in connection with an erase operation involving one or more memory cells of the NAND string, the erase voltage waveform comprises an initial level followed by an intermediate level and then a peak level; and
      applying a select gate waveform to a control gate of a select gate transistor in the NAND string, the select gate waveform comprises an initial level which is concurrent with the initial level of the erase voltage waveform followed by an intermediate level which is concurrent with the intermediate level of the erase voltage waveform and then a peak level which is concurrent with the peak level of the erase voltage waveform, the intermediate level of the erase voltage waveform is higher than the intermediate level of the select gate waveform, and the peak level of the erase voltage waveform is higher than the peak level of the select gate waveform.

2. The method of claim 1, wherein:
   the intermediate level of the erase voltage waveform and the intermediate level of the select gate waveform provide a drain-to-gate voltage of the select gate transistor which causes the select gate transistor to generate holes in a channel of the NAND string by gate-induced drain leakage.

3. The method of claim 1, wherein:
the intermediate level of the select gate waveform is low enough in comparison to a potential of a channel of the NAND string to avoid programming of the select gate transistor.

4. The method of claim 1, wherein:
the intermediate level of the erase voltage waveform is sufficiently higher than the intermediate level of the select gate waveform to cause the select gate transistor to generate holes in a channel of the NAND string, charging up the channel, but the channel is not charged up high enough in comparison to the intermediate level of the select gate waveform to erase the select gate transistor; and
the peak level of the erase voltage waveform is sufficiently higher than the peak level of the select gate waveform to cause the select gate transistor to continue to generate holes in the channel to further charge up the channel, but the channel is not charged up high enough in comparison to the peak level of the select gate waveform to erase the select gate transistor.

5. The method of claim 1, wherein:
the erase voltage waveform is among a plurality of erase voltage waveforms in the erase operation;
the plurality of erase voltage waveforms have respective peak levels which increase incrementally over the erase operation;
the select gate waveform is among a plurality of select gate waveforms in the erase operation;
the plurality of select gate waveforms have respective peak levels which increase incrementally over the erase operation; and
the respective peak levels of the plurality of erase voltage waveforms exceed the respective peak levels of the plurality of select gate waveforms by a fixed amount.

6. The method of claim 1, wherein:
the erase voltage waveform is among a plurality of erase voltage waveforms in the erase operation;
the plurality of erase voltage waveforms have respective peak levels which increase incrementally over the erase operation;
the select gate waveform is among a plurality of select gate waveforms in the erase operation;
the plurality of select gate waveforms have respective peak levels which increase incrementally over the erase operation;
the intermediate level of the erase voltage waveform is common to each erase voltage waveform of the plurality of erase voltage waveforms; and
the intermediate level of the select gate waveform is common to each select gate waveform of the plurality of select gate waveforms.

7. The method of claim 1, further comprising:
obtaining a count of program-erase cycles of the three-dimensional memory device; and
setting the intermediate level of the select gate waveform to be relatively lower when the count of program-erase cycles is relatively higher.

8. The method of claim 1, further comprising:
obtaining a count of program-erase cycles of the three-dimensional memory device; and
setting the intermediate level of the erase voltage waveform to be relatively lower when the count of program-erase cycles is relatively higher.

9. The method of claim 1, further comprising:
obtaining a measurement of a threshold voltage of the select gate transistor; and
setting the intermediate level of the select gate waveform to be relatively lower when the threshold voltage is relatively higher.

10. The method of claim 1, further comprising:
obtaining a measurement of a threshold voltage of the select gate transistor; and
setting the intermediate level of the erase voltage waveform to be relatively higher when the threshold voltage is relatively higher.

11. The method of claim 1, wherein the erase operation is one erase operation, and a prior erase operation is performed before the one erase operation, the method further comprising:
obtaining a measurement after the prior erase operation and before the one erase operation which indicates that a threshold voltage of the select gate transistor has increased above a maximum allowed level, wherein:
the erase voltage waveform is a multi-step waveform in the erase operation;
a prior erase operation uses a single-step waveform; and
a decision is made to use the multi-step waveform in place of the single-step waveform in response to the measurement.

12. The method of claim 1, further comprising:
determining that a count of program-erase cycles of the three-dimensional memory device exceeds a specified level, wherein:
the erase voltage waveform is a multi-step waveform in the erase operation;
a prior erase operation uses a single-step waveform; and
a decision is made to use the multi-step waveform in place of the single-step waveform in response to the determining.

13. The method of claim 1, further comprising:
in connection with the erase operation, floating and then driving lower a control gate voltage of the one or more memory cells during the peak level of the erase voltage waveform.

14. The method of claim 1, further comprising:
applying the select gate waveform to a control gate of a dummy word line in the NAND string.

15. A memory device, comprising:
a NAND string comprising one or more memory cells and a select gate transistor, the select gate transistor is at one end of the NAND string; and
a control circuit, the control circuit, to control the select gate transistor during an erase operation, is configured to:
apply an erase voltage waveform to the one end; and
during the erase voltage waveform, provide an initial drain-to-gate voltage for the select gate transistor, transition from the initial drain-to-gate voltage to an intermediate drain-to-gate voltage, and transition from the intermediate drain-to-gate voltage to a peak drain-to-gate voltage, wherein:
the erase voltage waveform comprises an initial voltage followed by an intermediate voltage and then a peak voltage;
the initial voltage of the erase voltage waveform is concurrent with an initial voltage applied to a control gate of the select gate transistor to provide the initial drain-to- gate voltage;
the intermediate voltage of the erase voltage waveform is concurrent with and greater than an intermediate voltage applied to the control gate of the select gate transistor to provide the intermediate drain-to-gate voltage; and the peak voltage of the erase voltage waveform is concurrent with and greater than a peak voltage applied to the control gate of the select gate transistor to provide the peak drain-to-gate voltage.

16. The memory device of claim 15, wherein:
the NAND string is formed in a stack of alternating conductive and dielectric layers in a three-dimensional memory structure.

17. The memory device of claim 15, wherein:
the NAND string comprises charge-trapping memory cells.

18. The memory device of claim 15 wherein:
the initial voltage, intermediate voltage and peak voltage applied to the control gate of the select gate transistor are in a select gate waveform;
the select gate waveform is among a plurality of select gate waveforms in the erase operation; and
the plurality of select gate waveforms have respective peak levels which increase incrementally over the erase operation.

19. A method for erasing in a memory device, comprising:
performing initial charging up a channel of a NAND string in a three-dimensional memory device using gate-induced drain leakage from a select gate transistor of the NAND string, the initial charging up comprises providing an initial drain-to-gate voltage of the select gate transistor which exceeds a first level but not a second level;
performing additional charging up the channel using gate-induced drain leakage from the select gate transistor, the additional charging up comprises increasing a drain-to-gate voltage of the select gate transistor from the initial drain-to-gate voltage of the select gate transistor to an additional drain-to-gate voltage of the select gate transistor which exceeds the second level;
while the channel is charged up in response to the initial charging up and the additional charging up, floating a control gate voltage of one or more memory cells of the NAND string and then driving lower the control gate voltage of one or more memory cells of the NAND string;
obtaining a count of program-erase cycles of the memory device; and
setting the initial drain-to-gate voltage based on the count of program-erase cycles.

20. The method of claim 19, further comprising:
obtaining a measurement of a threshold voltage of the select gate transistor; and
setting the initial drain-to-gate voltage based on the measurement.

21. A memory device, comprising:
a set of series-connected transistors comprising memory cells and a select gate transistor; and
a control circuit, the control circuit, to perform an erase operation for one or more of the memory cells is configured to:
bias the select gate transistor with one drain-to-gate voltage and then increase a bias of the select gate transistor from the one drain-to-gate voltage to an additional drain-to-gate voltage which is higher than the one drain-to-gate voltage to bias the select gate transistor with the additional drain-to-gate voltage, wherein:
the control circuit, to bias the select gate transistor with the one drain-to-gate voltage, is configured to concurrently apply an intermediate voltage to one end of the set of series-connected transistors and an intermediate voltage to a control gate of the select gate transistor, and to bias the select gate transistor with the additional drain-to-gate voltage, is configured to concurrently apply a peak voltage to the one end of the set of series-connected transistors and a peak voltage to the control gate of the select gate transistor, the intermediate voltage applied to the one end of the set of series-connected transistors is greater than the intermediate voltage applied to the control gate of the select gate transistor, and the peak voltage applied to the one end of the set of series-connected transistors is greater than the peak voltage applied to the control gate of the select gate transistor.

* * * * *